(12) United States Patent
Chun

(10) Patent No.: US 7,208,932 B1
(45) Date of Patent: Apr. 24, 2007

(54) VOLTAGE DETECTOR

(76) Inventor: James K. Chun, 2102 F. Walsh Ave., Santa Clara, CA (US) 95050

( * ) Notice: Subject to any disclaimer, the term of this patent is extended or adjusted under 35 U.S.C. 154(b) by 0 days.

(21) Appl. No.: 11/195,562

(22) Filed: Aug. 1, 2005

Related U.S. Application Data

(63) Continuation-in-part of application No. 10/305,492, filed on Nov. 27, 2002.

(51) Int. Cl.
*G01R 19/165* (2006.01)

(52) U.S. Cl. .................... 324/72.5; 324/133

(58) Field of Classification Search ............... 324/72.5, 324/133
See application file for complete search history.

(56) References Cited

U.S. PATENT DOCUMENTS

| | | | |
|---|---|---|---|
| 3,828,256 A | 8/1974 | Liu | 324/133 |
| 5,029,188 A * | 7/1991 | Lexa | 377/16 |
| 5,103,165 A | 4/1992 | Sirattz | 324/133 |
| 5,498,934 A | 3/1996 | Nilssen | 315/224 |
| D434,164 S | 11/2000 | Galli | D26/49 |
| 6,168,288 B1 | 1/2001 | St. Claire | 362/184 |
| 6,231,207 B1 | 5/2001 | Kennedy et al. | 362/158 |
| D455,513 S | 4/2002 | Galli | D26/49 |
| 6,626,556 B2 | 9/2003 | Galli | 362/205 |
| 6,769,786 B2 | 8/2004 | Galli | 362/158 |

* cited by examiner

*Primary Examiner*—David Vu
(74) *Attorney, Agent, or Firm*—Dean A. Craine

(57) ABSTRACT

A voltage detector used to determine if an exposed or unexposed wire or terminal is "hot." The voltage detector includes a low density EMF field detecting circuit and a high density EMF field detecting circuit each coupled to an indicator to inform the user that the "hot" wire or terminal is nearby. In the preferred embodiment, the voltage detector includes an LED flashlight that uses a voltage multiplying circuit that enables it to use a single AA or AAA battery. The voltage multiplying circuit raises the battery voltage from 1.5 volts to approximately 5 volts required to sufficiently energize the main LED. In the preferred embodiment, the LED's reflector acts as the sensor probe for detecting the presence of electric field densities.

18 Claims, 5 Drawing Sheets

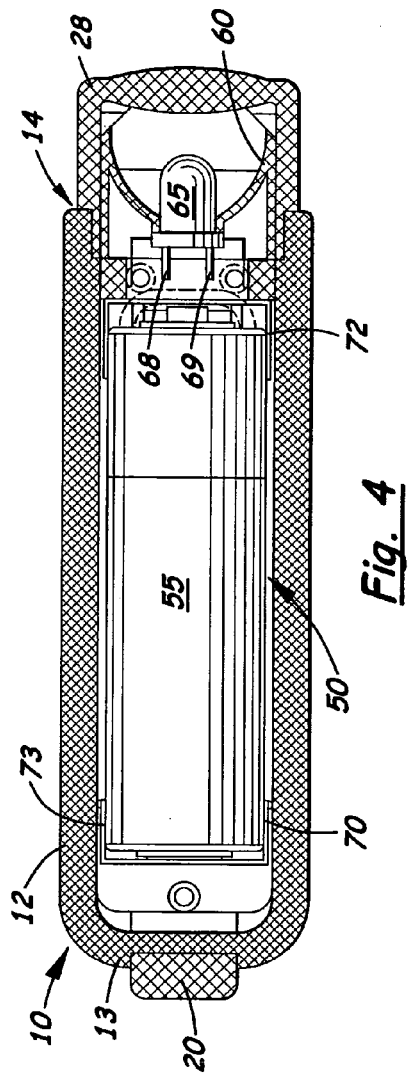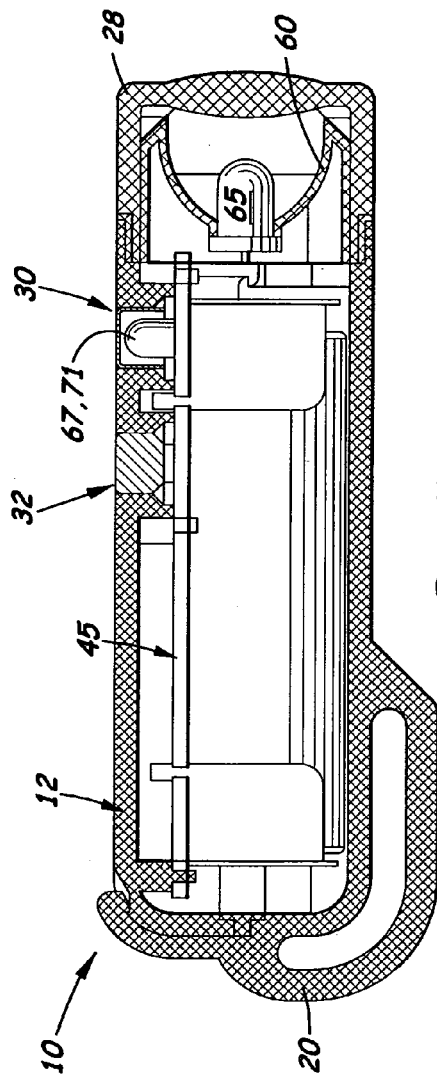

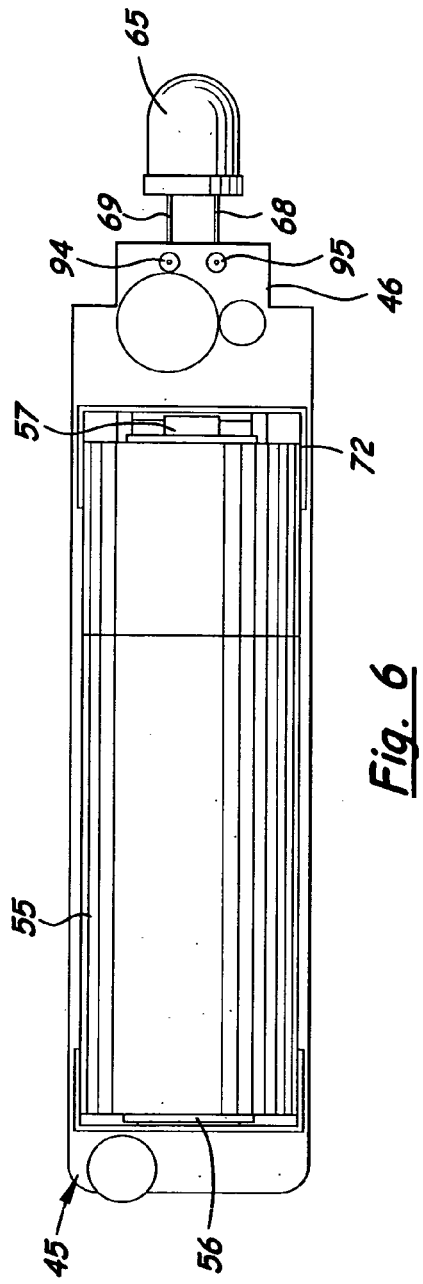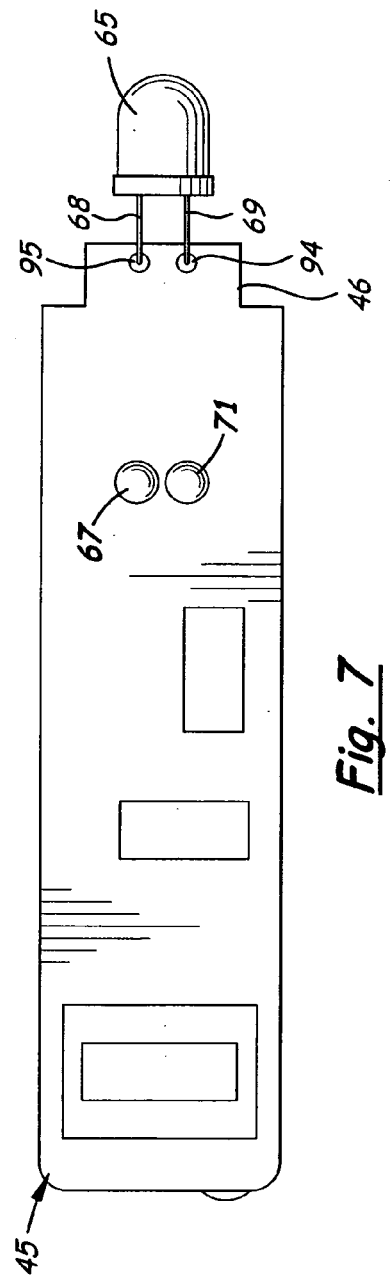
Fig. 6
Fig. 7

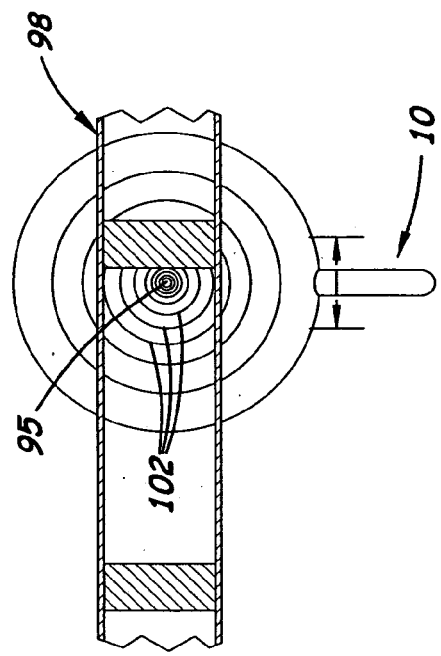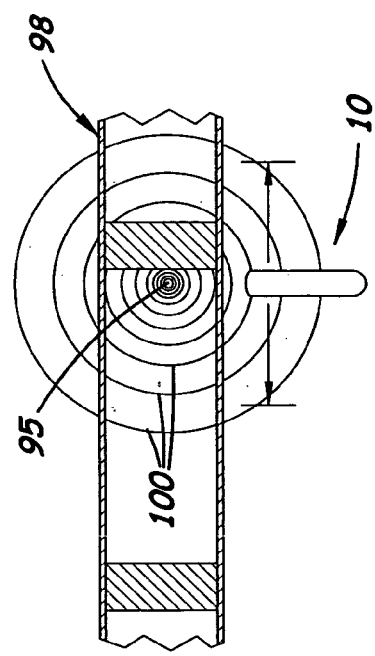

100
VOLTAGE DETECTOR

This is a continuation-in-part application of U.S. patent application Ser. No. 10/305,492 and filed on Nov. 27, 2002 now U.S. Pat. No. 6,924,605.

BACKGROUND OF THE INVENTION

1. Field of the Invention

The present invention relates to voltage detectors, and more particularly, to voltage detectors capable of detecting the location of a hidden "hot" wire or terminal located behind a surface.

2. Description of the Related Art

Electricians commonly use a handheld, lightweight AC voltage detector to locate the hot, neutral and ground wires and terminals. An example of such a detector is sold by Fluke (Model Number 1AC and 1LAC) which is relatively small and fits into a shirt pocket. During use, the tip of the sensor glows red if a voltage is detected in a wire or terminal.

In order to make them small and lightweight for transport in a pocket, the detectors often use watch batteries. Unfortunately, watch batteries have relatively low storage capacity which severely limits their life spans. To prevent electrical shocks that may occur by using a detector with discharged batteries, many detectors include test buttons that are pressed to determine if the batteries are sufficiently charged for testing.

Many electricians work in dark environments that make it difficult to see wires and terminals. In order to test a wire or a terminal, the user must hold a flashlight or some other light source in his or her hand or mouth.

LED flashlights found in the prior art generally consist of one or more LED bulbs located inside a housing containing a plurality of batteries. Because LEDs require 5 volts of DC current for optimal illumination, at least three AA or AAA batteries connected in a series are used. As a result, most bright LED flashlights have relatively large housings. When a LED flashlight with a smaller housing is desired, for example with a LED key ring or fob, a single battery may be used, but the flashlight illumination is substantially reduced.

It is commonly known that high and low density EMF's surround "hot" electrical wires and terminals and that electricians commonly use handheld, lightweight AC voltage detectors to detect the EMF to determine whether a wire or terminal is "hot". Because typical AC voltage detectors in the prior art detect only a relatively high density EMF, the detector's sensing probe or tip must touch or be positioned close to the "hot" wire or terminal for detection. Unfortunately, the thick drywall panels (⅝ to ¾ inch), and hollow 6 to 8 inch studded walls commonly used today in house construction, often position a "hot" wire or terminal at a depth in a wall beyond the radius of their high density EMF.

In order to test a wire or a terminal in a dark environment with a voltage detector, the electrician must simultaneously hold the flashlight to illuminate the wire or terminal and position the sensing probe or tip directing against the wire or terminal.

What is needed is a voltage detector capable of detecting both low and high density EMF's from a "hot" wire and terminal thereby enabling the detector to precisely locate them.

What is needed is a combination voltage detector and LED flashlight that is relatively small and easy to use.

SUMMARY OF THE INVENTION

It is an object of the present invention to provide a voltage detector capable of determining if an exposed or unexposed wire or terminal is "hot".

It is another object of the present invention to provide such a detector that detects the EMF emitted from the "hot" wire or terminal.

It is a further object of the present invention to provide such a detector that can detect both low and high EMF's.

It is a further object of the present invention to provide such a detector that can be combined with an LED flashlight.

These and other objects of the invention are met by a multiple field voltage detector disclosed herein capable of detecting at least two different density fields produced by a "hot" wire or terminal using a single sensing element. The detector includes a low density EMF detection circuit that detects the presence of a low density EMF and a high density EMF detecting circuit that detects the presences of a high density EMF produced by a standard 115 volt AC wire. Both circuits are connected to one sensing probe located at one end of the detector. When the detector's sensing probe is positioned within a "hot" wire or terminal's low density EMF, the low density EMF detecting circuit is activated which activates a first indicator to inform the user that the "hot" wire is located nearby. When the detector's sensing probe touches the "hot" wire or terminal or is positioned within the "hot" wire or terminal's high density EMF, the high density EMF detecting circuit is activated which deactivates the first indicator and activates a second indicator. An identifying indicator means is coupled to each circuit which informs the user when the two density fields are detected. By moving the detector around the area, and monitoring the activation of the two indicating means, the precise located of the "hot" wire or terminal can be easily determined. Also, because the neutral and hot terminals on a standard light switch or plug emit different EMF's, the detector may also be used to identify the neutral and hot terminals of the switch or plug.

In the preferred embodiment, the detector is combined with a LED flashlight that includes a LED light circuit, a power circuit, a voltage multiplying circuit and a reflector. The reflector is made of electrical conductive material enabling it to act as the sensing probe for detecting both low and high density EMF's.

DESCRIPTION OF THE DRAWINGS

FIG. 4 is a sectional, top plan view of the invention.

FIG. 5 is a sectional, left side elevational view of the invention.

FIG. 6 is a left side elevational view of the invention showing the relative positions of the battery, printed circuit board, the reflector and LED.

FIG. 7 is a right side elevational view of the printed circuit board and LED used in the invention.

FIGS. 9A and B are sequential illustrations showing the process used for finding a hidden wire in a wall.

DESCRIPTION OF THE PREFERRED EMBODIMENT(S)

Figure 1:
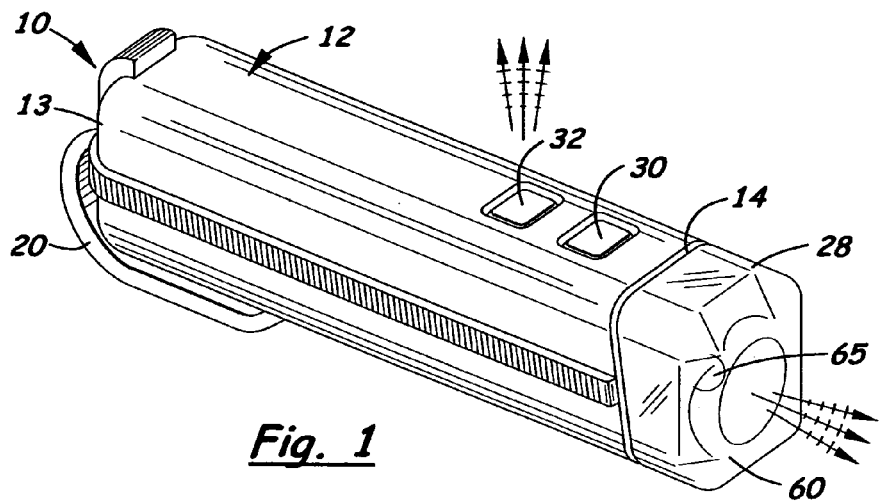
FIG. 1 is a perspective view of the multiple field voltage detector with an LED flashlight component assembled therein.

Disclosed herein is a multiple field voltage detector, generally denoted as 10 that is used to detect at least two different density fields produced by a "hot" wire or terminal. When using the detector 10, a user is able to easily determine not only if an exposed wire or terminal is "hot", but also precisely locate a hidden "hot" wire 95 or terminal located behind a wall 98.

The detector 10 includes a low density EMF detecting circuit 120 that detects a low density EMF field indicated generally as 100, and a high density EMF detecting circuit 140 that detects the high level EMF field 102, generally indicated as 102. Each circuit, 120 and 140 is connected to a reflector 60 located at the tip of the detector 10. When the detector 10 is held perpendicular to the wall 98 so that the reflector 60 positioned within the low or high EMF fields produced by the "hot" wire or terminal 95 located inside the wall 98, first and second indicator lights are sequentially activated and deactivated to inform the user that the "hot" wire or terminal 95 is nearby.

In the preferred embodiment shown in the accompanying Figs. the detector 10 is similar to the combination voltage detector and LED flashlight developed by the inventor and described in an earlier filed U.S. patent application (Ser. No. 10/305,492) and filed on Nov. 27, 2002. The construction and design of the combination voltage detector and LED flashlight is now all incorporated herein.

The detector 10 includes an elongated hollow body 12, with a closed end 13 and a transparent main lens 28 that attaches over an open end 14. The body 12, which is made of a clear or colored plastic or similar material, is made of two half components 17, 18 that snap together along the body's central longitudinal axis 19. Formed on the closed end 13 of the body 12 is an optional key ring 20.

Attached over the open end 14 of the body 12 is a main lens 28 made of plastic or similar material. Located inside the main lens 28 is a transversely aligned chrome plated reflector 60 which acts as a sensing probe for the low and high density EMF detecting circuits 120, 140, respectively, discussed further below.

Figure 2:
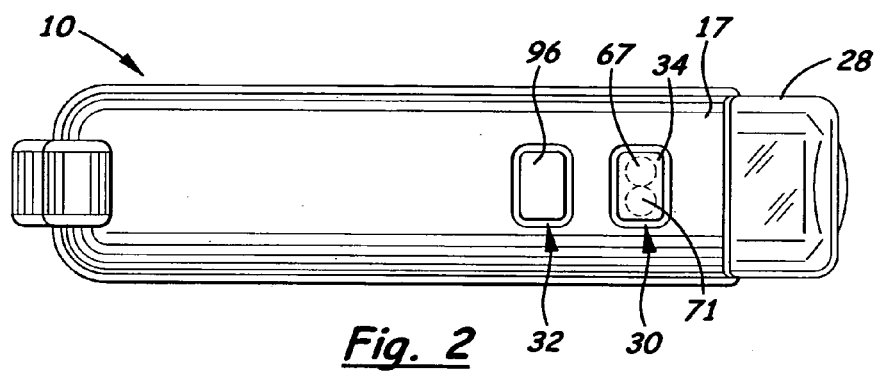
FIG. 2 is a top plan view of the invention.

As shown in FIGS. 1 and 2, formed on the outer surface of the body 12 are two holes 30, 32 through which a main ON/OFF switch button 96 and a button lens 34 extend, respectively.

Shown in FIGS. 4–7, an elongated printed circuit board 45 is longitudinally aligned inside the main body 12. Longitudinally aligned and extending from the proximal end of the circuit board 45 is an integrally formed neck 46 that contains terminals 94, 95 to which the terminals 68, 69, respectively, on the flashlight's main LED 65 connect. The main printed circuit board 45 is slightly off-set from the longitudinal axis 19 of the main body 12, thereby creating a longitudinally aligned cavity 50 for a single AA or AAA battery 55.

Figure 3:
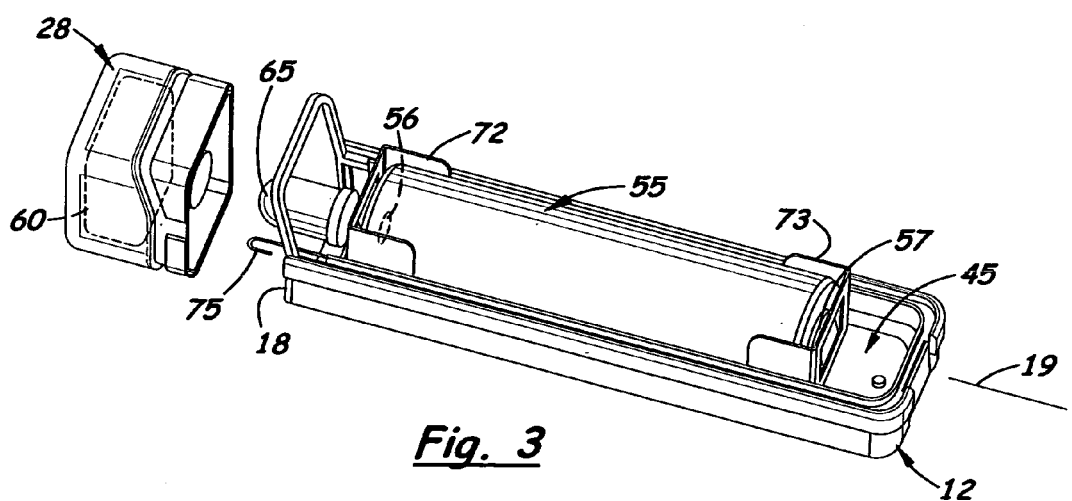
FIG. 3 is a partially exploded view of the invention.

As also shown in FIGS. 3–5, attached to the opposite ends of the printed circuit board 45 are two contact strips 72, 73 respectively, that connect to the positive and negative terminals 56, 57, respectively, on the battery 55. During assembly, a single AA or AAA battery 55 (shown) is longitudinally aligned inside the battery cavity 50 and connected between the two contact strips 72, 73. Mounted longitudinally inside the battery cavity 50 and adjacent to the battery 55 is a contact bar 75 that electrically connects the reflector/sensor probe 60 to the voltage detector circuit 100.

Figure 8:
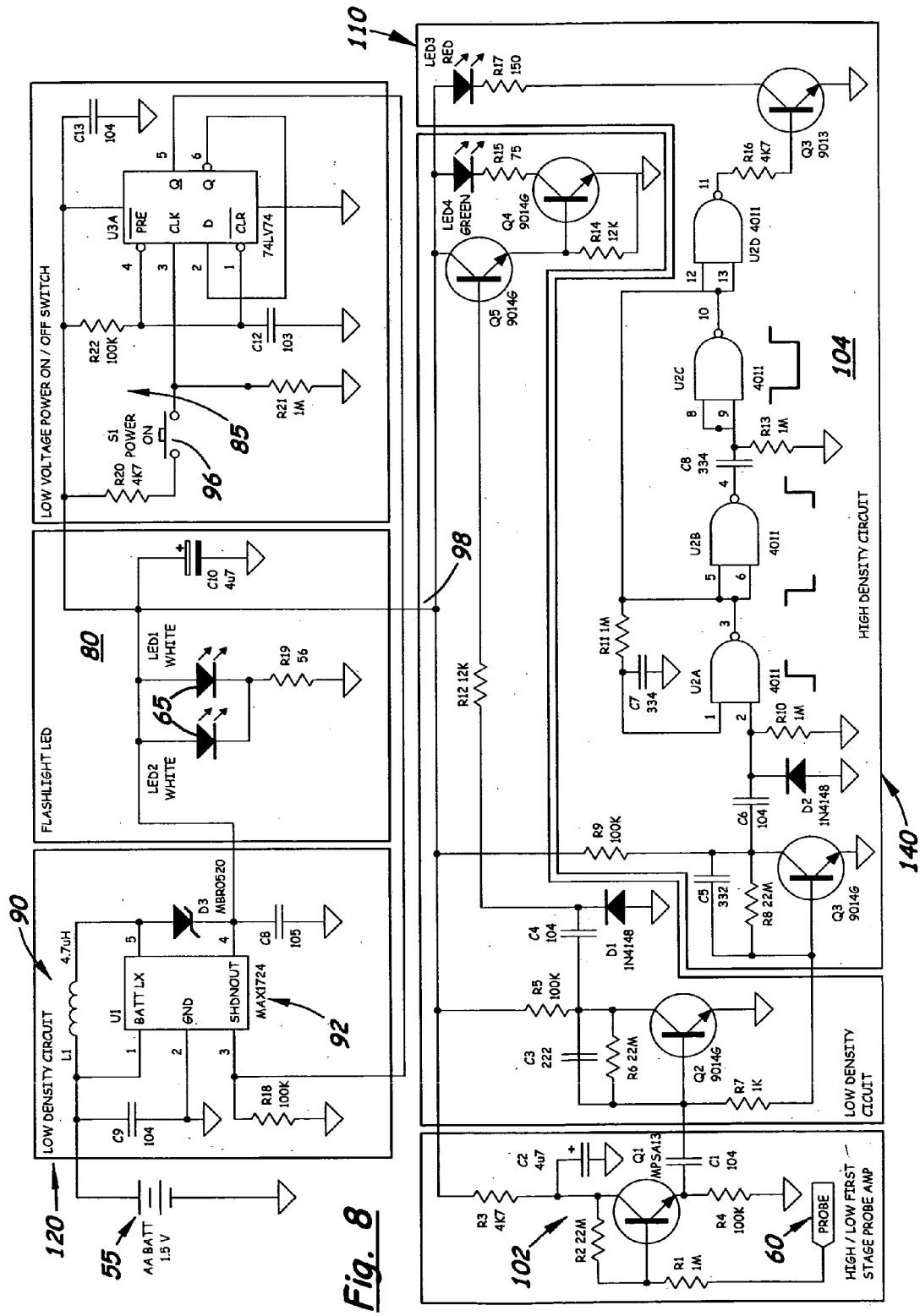
FIG. 8 is a schematic diagram of the electrical circuit used in the voltage detector.

FIG. 8 is a schematic of the printed circuit board 45 used in the detector 10. The printed circuit board 45 includes a low density field circuit 120, a high density field circuit 140, an LED flashlight circuit 80, a power circuit 85, and a voltage multiplying circuit 90. The electrical components used in the low density field and high density circuits are shown in FIG. 8 and listed in Table 1. The LED flashlight circuit 80 includes at least one main LED 65. The power circuit 85 includes a main ON/OFF switch 96 which is mounted on the PCB 45 so that it extends into the rear hole 32 formed on the top surface of the housing. During use, the switch 96 is pressed continuously to activate the power circuit 85 and the main LED 65.

As discussed in the inventor's patent application referenced above, the voltage multiplying circuit 90 includes an optional synchronous boost converter 92 that connects to the 1.5 volt battery 55 and increases its voltage. In the preferred embodiment, the synchronous boost converter 92 is a six lead thin SOT with a fixed frequency, step-up DC/DC converted capable of supplying up to 5.0 V at 150 mA from a single AA or AAA battery 55. Such converters contain an internal NMOS switch and a PMOS synchronous rectifier. An example of a synchronous boost converter (Model No. LTC 3490) that may be used is sold by Linear Technology Corporation located in Milpitas, Calif.

In the preferred embodiment, both the low and high density circuits 120, 140 are connected to the voltage multiplying circuit 90 through an output voltage setting line 98. The output voltage setting line 98 is connected to the metallic or metallic coated reflector 60 designed to detect a low and high EMF signal from an external A.C. electrical power source not shown. As stated above, the reflector 60 is located near the front end of the main LED 65. An amplifier 102 is connected to the reflector 60 which is designed to increase the EMF signal therefrom.

Connected to the PCB 45 are two different color secondary LED's 67, 71, that are independently activated when a low EMF field 100 and a high EMF field 102 is detected, respectively. More specifically, the first secondary LED 67 is designed to detect low EMF field 100 (near 40 VAC) while the second secondary LED 71 is designed to detect high EMF field 102 (near 300 VAC). As shown in FIGS. 9A and 9B, and outer, low EMF field 100 and an inner, high EMF 102 field radially surrounds an EMF source (wire or terminal 95). When the exact location of the EMF source is unknown, for example, behind a wall 98, by moving the reflector 60 over the outer surface of the wall 98 and by monitoring which secondary LED 67, 71 is illuminated and their relative brightness, the exact location the of EMF source behind the wall 98 can be detected.

In the preferred embodiment, the first secondary LED 67 is red and the second secondary LED 71 is blue. Both LED's 67, 71 are mounted on along the upper edge of the PCB 45 and extends upward through the front hole 30. When the main switch 96 is activated, and a low EMF field 100 is detected, the first secondary LED 67 becomes dimly illuminated (or pink) gradually becomes dark (red) as the reflector 60 is moved closer to the EMF source. As the EMF field gets stronger, the first secondary LED 67 gradually dims and the second secondary LED 71 is gradually activated from light to dark blue. By monitoring the final color of the secondary LED's 67, 71 and their intensity, the exact location of the EMF source can be determined. Although in the preferred embodiment, the two secondary LED's are red and blue, respectively, it should be understood that they may be any two combinations of distinguishing colors.

During use, a AA or AAA battery 55 is placed inside the battery cavity 50. The main lens 28 is then placed over the reflector 60 thereby preventing the reflector 60 from directly contacting a "hot" wire or terminal 95. The main ON/OFF switch 96 is then pressed and held to activate the power circuit 85, main LED flashlight circuit 80, and the voltage detector circuit 100 and the two voltage sensor circuits 120, 140. In the preferred embodiment, the main LED 65 is activated when the switch 96 is activated, so that a user may easily find the "hot" wire or terminal 95, or area to be tested. When detecting a 'hot' 115 or 230 volt AC circuit, behind a hidden surface, such as a wall 98, the detector 10 is held perpendicular to the wall 98 so that the lens or reflector 60 is pressed against the outer surface of the wall 98. When the reflector 60 is placed within approximately 10 cm) of the "hot" wire or terminal 95, the first secondary LED 67 begins to illuminate pale pink. Gradually, when the reflector 60 moves closer to the "hot" wire or terminal 95, the first secondary LED 67 is deactivated and the second secondary LED 71 is activated. Because the flashlight circuit 80 and the two voltage detecting circuits 120, 140 are both connected to the power circuit 85, activation of the main LED 65 automatically informs the user that sufficient electrical energy is provided to the voltage detector circuits 120, 140.

Table 1 lists the codes, names, and functions of the components shown in FIG. 8.

In compliance with the statute, the invention described herein has been described in language more or less specific as to structural features. It should be understood, however, that the invention is not limited to the specific features shown, since the means and construction shown, is comprised only of the preferred embodiments for putting the invention into effect. The invention is therefore claimed in any of its forms or modifications within the legitimate and valid scope of the amended claims, appropriately interpreted in accordance with the doctrine of equivalents.

TABLE 1

| Designators | Qty | Description |
| --- | --- | --- |
| C1 | 1 | Chip Capacitor |
| C2 | 1 | Chip Capacitor |
| C3 | 1 | Chip Capacitor |
| C4 | 1 | Chip Capacitor |
| C5 | 1 | Chip Capacitor |
| C6 | 1 | Chip Capacitor |
| C8 | 1 | Chip Capacitor |
| C9 | 1 | Chip Capacitor |
| C10 | 1 | Electro 2 |
| D1 | 1 | S. Diode |
| D2 | 1 | Diode |
| D3 | 1 | Diode |
| LED1 | 1 | LED Lamp |
| LED2A/B | 1 | Bi-color LED |
| Q1 | 1 | NPN Transistor |
| Q2 | 1 | NPN Transistor |
| Q3 | 1 | NPN Transistor |
| R1 | 1 | Chip Resistor |
| R10 | 1 | Chip Resistor |
| R11 | 1 | Chip Resistor |
| R12 | 1 | Chip Resistor |
| R13 | 1 | Chip Resistor |
| R14 | 1 | Chip Resistor |
| R15 | 1 | Chip Resistor |
| R2 | 1 | Chip Resistor |
| R3 | 1 | Chip Resistor |
| R4 | 1 | Chip Resistor |
| R5 | 1 | Chip Resistor |
| R6 | 1 | Chip Resistor |
| R7 | 1 | Chip Resistor |
| R8 | 1 | Chip Resistor |
| R9 | 1 | Chip Resistor |
| PCB | 1 | Printed Circuit Board |
| U1 | 1 | Synchronous Boost Converter |
| U2 | 1 | CMOS Quad 2-input NAND gate |

I claim:

1. A voltage detector, comprising:
   a. a battery;
   b. a power circuit that includes an on/off switch and connected to said battery;
   c. a light source connected to said power circuit;
   d. at least one voltage detecting circuit connected to said power circuit; and,
   e. an electrically conductive reflector disposed around said light source, said reflector being connected to said voltage detecting circuit used to detect an external electric field located near said voltage detecting circuit.

2. The voltage detector as recited in claim 1, wherein said battery supplies approximately 1.5 Volts when charged.

3. The voltage detector, as recited in claim 1, wherein said light source is a LED light circuit with at least one LED connected thereto.

4. The voltage detector, as recited in claim 3, further including a lens disposed around said LED light and said reflector.

5. The voltage detector, as recited in claim 1, wherein said voltage detecting circuit includes at least one LED capable of illuminating at a visually distinguishable color or brightness when a first EMF field density emitted from an electrical power source is detected.

6. The voltage detector, as recited in claim 1, further including a second voltage detecting circuit connected to a second light source capable of detecting and indicating an EMF field density lower or higher than said first EMF field density detected by said first voltage detecting circuit.

7. The voltage detector, as recited in claim 1, further including a voltage boosting circuit that boost the voltage of said battery to said voltage detector circuit.

8. The voltage detector, as recited in claim 6, further including a voltage boosting circuit that boost the voltage of said battery to said first voltage detecting circuit and said second voltage detecting circuit.

9. A voltage detector, comprising:
   a. a main body;
   b. a sensor probe located on said main body;
   c. at least two EMF field detecting means coupled to said sensor probe, said EMF field detecting means capable of detecting two density fields produced by an AC electrical power source;
   d. an indicator means coupled to said EMF field detector means used to indicate when said sensor probe is positioned within a field density emitted from an AC electrical power source; and,
   e. at least one battery connected to said EMF field detecting means to supply electrical power thereto.

10. The voltage detector, as recited in claim 9, further comprising a voltage multiplier circuit that multiplies the voltage delivered by said battery connected to said EMF field detecting means.

11. The voltage detector, as recited in claim 10, wherein said synchronous boost converter is capable of boosting approximately 1.5 volts supplying up to 4.5–5.0 volts at 150 mA.

12. The voltage detector, as recited in claim 9, further comprising at least one main LED mounted on said main body, said LED capable of being activated continuously thereby enabling said detector to be used as a flashlight.

13. The voltage detector, as recited in claim 12, wherein said sensor probe is an electrical conductive reflector surrounding said main LED.

14. The voltage detector, as recited in claim 13, wherein said indicator means is a first visual indicator coupled to said EMF field detecting means that indicates the detection of a low level EMF field and a second visual indicator coupled to said EMF field detecting means that indicates a high level EMF field.

15. The voltage detector, as recited in claim 14, wherein said first visual indicator is a first LED.

16. The voltage detector, as recited in claim 15, wherein said first LED blinks when said first predetermined EMF field is detected.

17. The voltage detector as recited in claim 15, wherein said visual indicator includes a second LED mounted on said main body that is deactivated when said power switch is activated and no EMF field and activated when a second predetermined EMF field is detected.

18. A voltage detector, comprising:

a. a main body;

b. a transparent main lens attached to one end of said main body;

c. a printed circuit board disposed inside said main body, said printed circuit board including a low density EMF field detecting circuit, a high density EMF field detecting circuit, a power circuit, a voltage multiplier circuit that increases the voltage of a battery connected to said power circuit;

d. at least one main LED connected to said voltage multiplier circuit;

e. a sensor probe connected to said low density EMF field detecting circuit and said high density EMF field detecting circuit;

f. a first indicator connected to said low density EMF field detecting circuit;

g. a second indicator connected to said high density EMF field detecting circuit;

h. an ON-OFF switch connected to said power circuit on said printed circuit board; and;

i. a battery connected to said power circuit and used to energize said main LED.

* * * * *